US012110177B2

(12) United States Patent
Ito et al.

(10) Patent No.: US 12,110,177 B2
(45) Date of Patent: Oct. 8, 2024

(54) CARRIER SYSTEM

(71) Applicant: MURATA MACHINERY, LTD., Kyoto (JP)

(72) Inventors: Naohisa Ito, Inuyama (JP); Eijiro Aoki, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 1037 days.

(21) Appl. No.: 17/045,787

(22) PCT Filed: Jan. 30, 2019

(86) PCT No.: PCT/JP2019/003247
§ 371 (c)(1),
(2) Date: Oct. 7, 2020

(87) PCT Pub. No.: WO2019/211933
PCT Pub. Date: Nov. 7, 2019

(65) Prior Publication Data
US 2021/0155406 A1  May 27, 2021

(30) Foreign Application Priority Data

May 1, 2018 (JP) ................................. 2018-088283

(51) Int. Cl.
*B65G 1/04* (2006.01)
*G05D 1/00* (2024.01)
*H01L 21/677* (2006.01)

(52) U.S. Cl.
CPC ......... *B65G 1/0492* (2013.01); *G05D 1/0289* (2013.01)

(58) Field of Classification Search
CPC .................. B65G 1/0492; B65G 47/61; G05D 2201/0216; G05D 1/0229; G05D 1/0289;
(Continued)

(56) References Cited

U.S. PATENT DOCUMENTS 4,817,750 A      4/1989  Ishida et al.
2007/0193859 A1*  8/2007  Kyutoku ............... B65G 13/10
                                                    198/787

(Continued)

FOREIGN PATENT DOCUMENTS

JP          63-029813 A      2/1988
JP          01-133801 A      5/1989
JP          2009-214974 A    9/2009

*Primary Examiner* — Khoi H Tran
*Assistant Examiner* — Tanner L Cullen
(74) *Attorney, Agent, or Firm* — Keating & Bennett, LLP

(57) ABSTRACT

A transport system includes transport vehicles, and a controller to control traveling of the transport vehicles. The track includes a first main track, junction points on the first main track and spaced apart from each other, and branch tracks each connected to the first main track via the junction points different from one another. The junction points are spaced apart from each other on the first main track. On each of the branch tracks, a stop position corresponding to a delivery port for each transport vehicle to deliver and receive a load is provided. The controller controls the respective transport vehicles stopping at the stop positions of the branch tracks to control a transport vehicle on a downstream branch track to start simultaneously with or before a transport vehicle on an upstream branch track.

16 Claims, 12 Drawing Sheets

(58) Field of Classification Search
CPC ............... G05D 1/0263; G05D 1/0261; G05B 19/41895; B25J 5/02; H01L 21/67724
See application file for complete search history.

(56) References Cited

U.S. PATENT DOCUMENTS

| | | | |
|---|---|---|---|
| 2011/0178657 A1* | 7/2011 | Harasaki | G05B 19/41895 701/2 |
| 2012/0004767 A1* | 1/2012 | Tominaga | H01L 21/67736 700/230 |
| 2014/0172223 A1* | 6/2014 | Murphy | G05D 1/0289 701/25 |
| 2015/0260535 A1* | 9/2015 | Yoshida | G05D 1/0297 701/25 |
| 2018/0122671 A1* | 5/2018 | Niiyama | B65G 43/10 |
| 2018/0275681 A1* | 9/2018 | Gariepy | G05D 1/0297 |

* cited by examiner

*Fig.2*
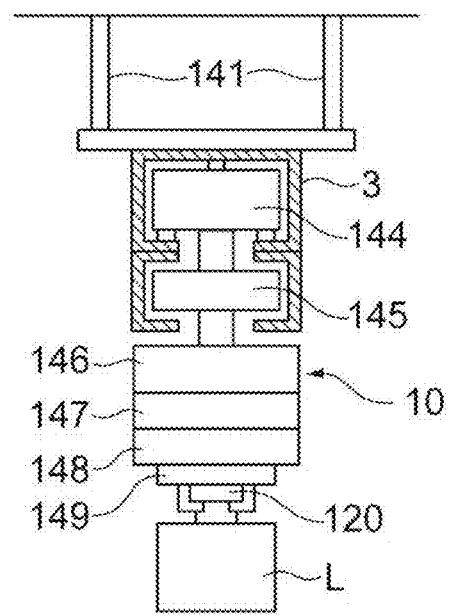
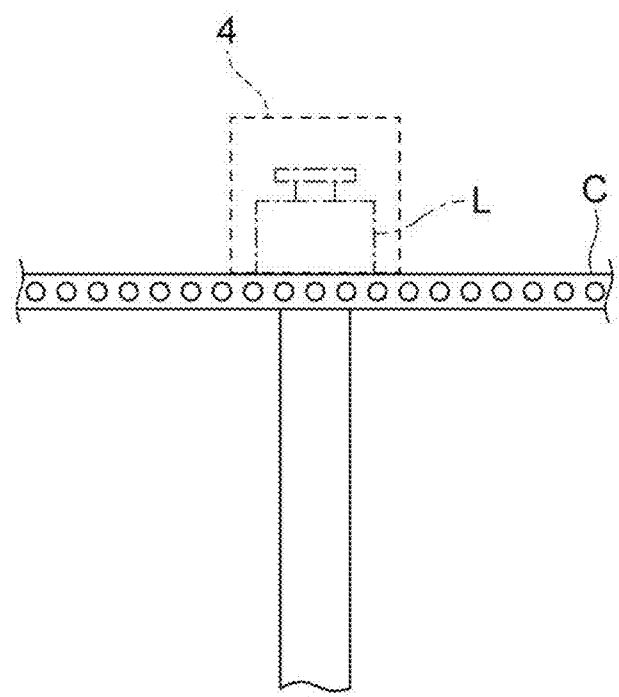

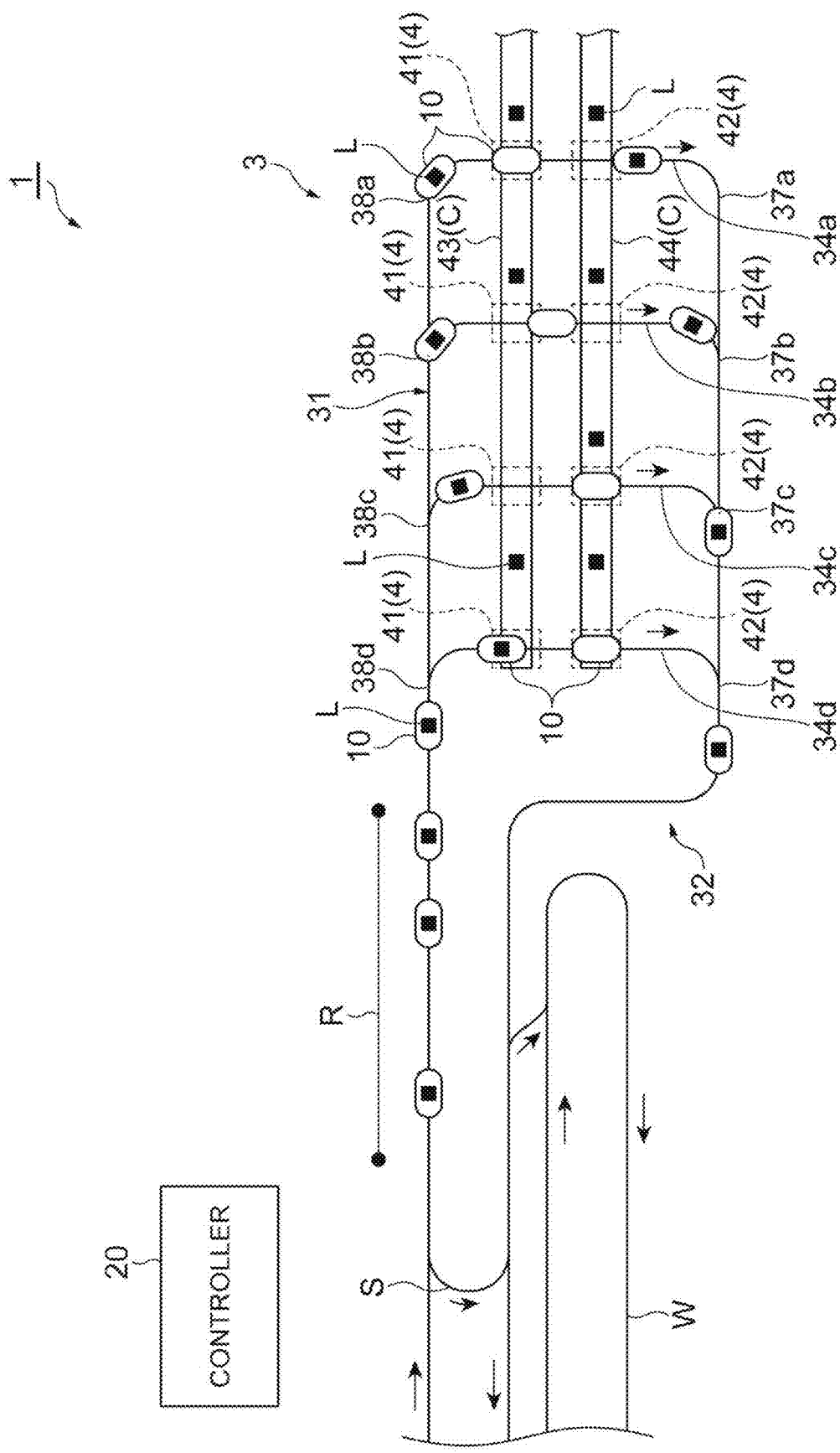

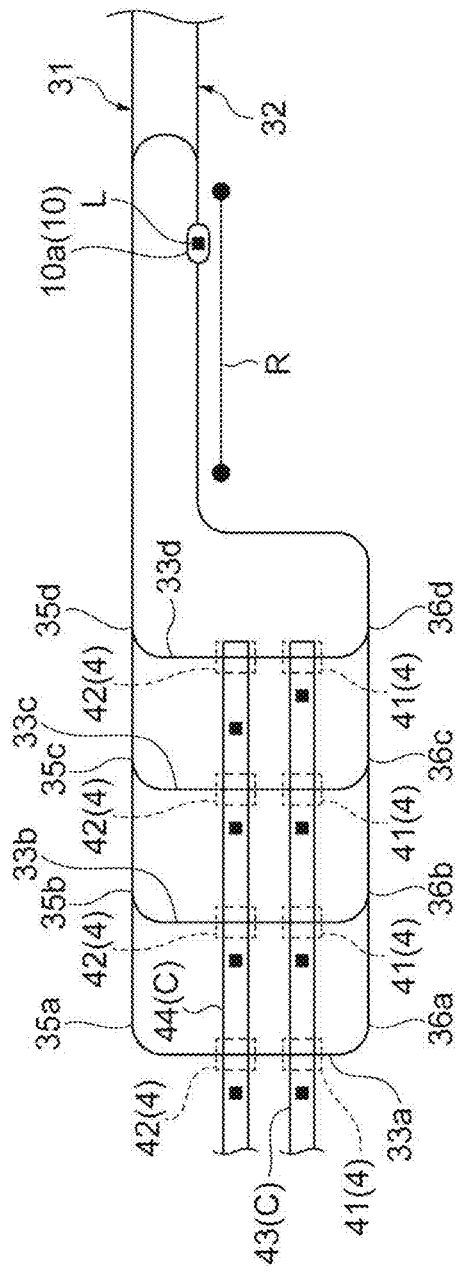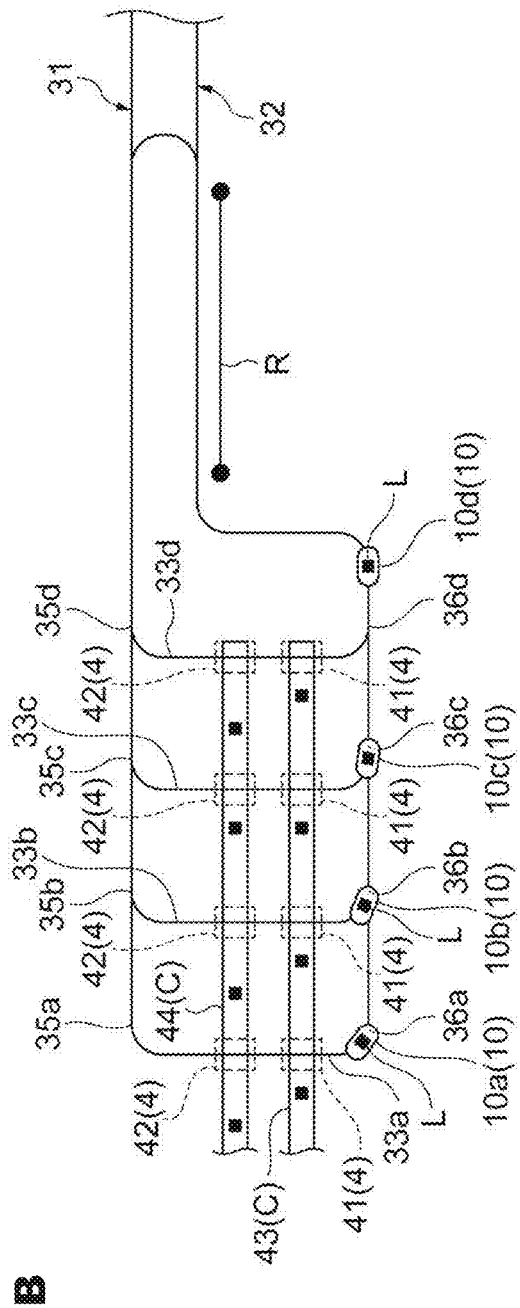

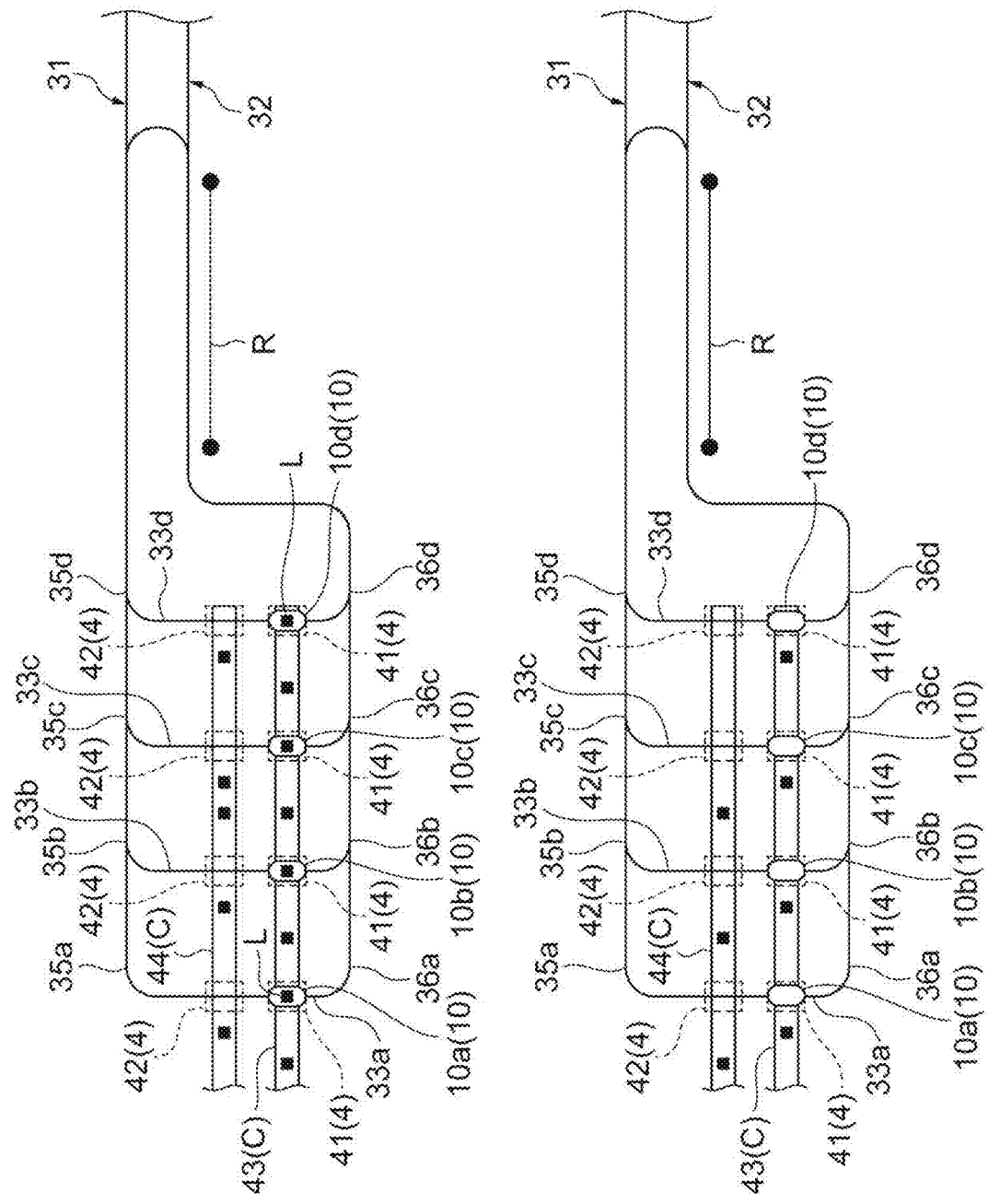

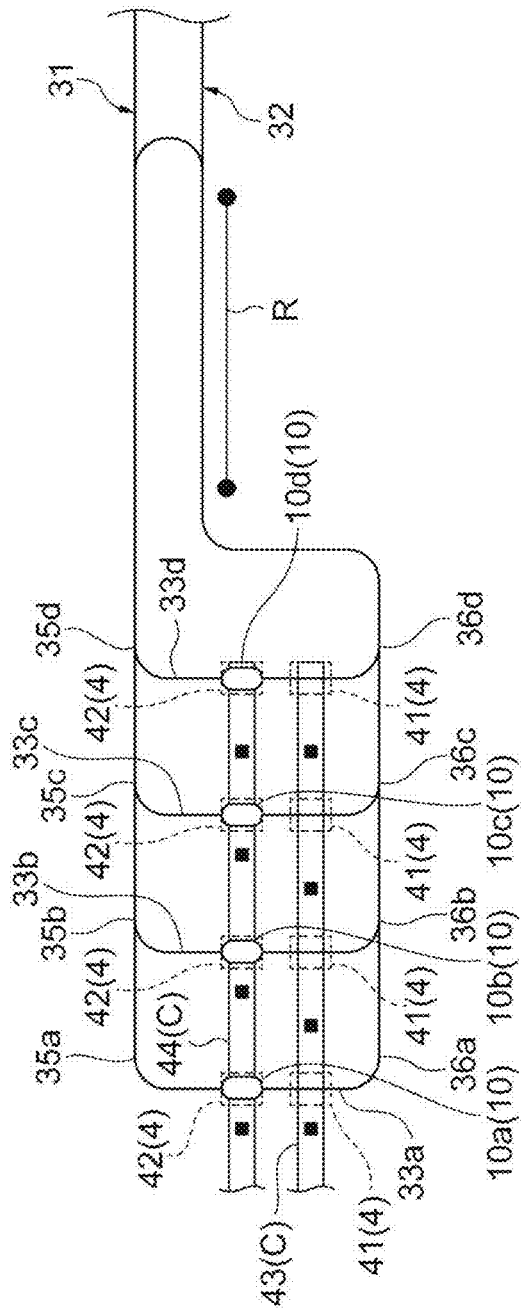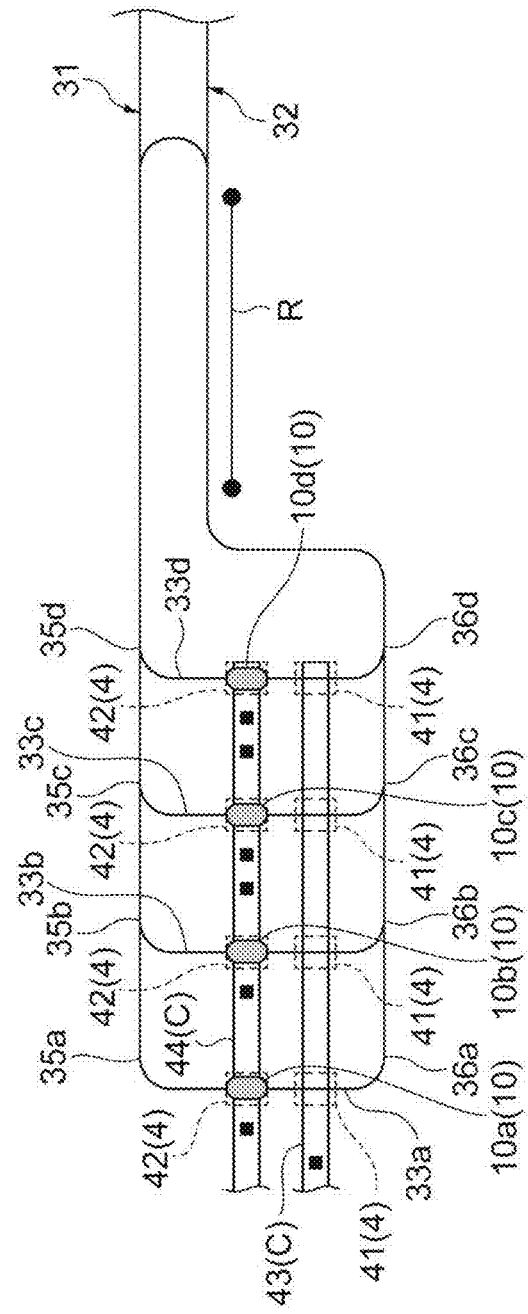

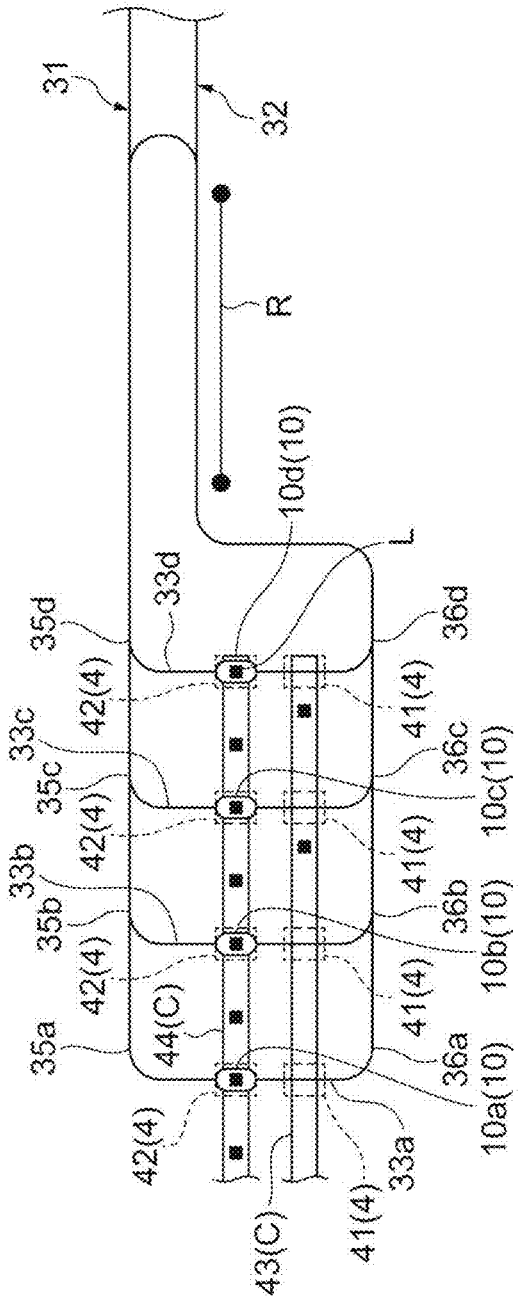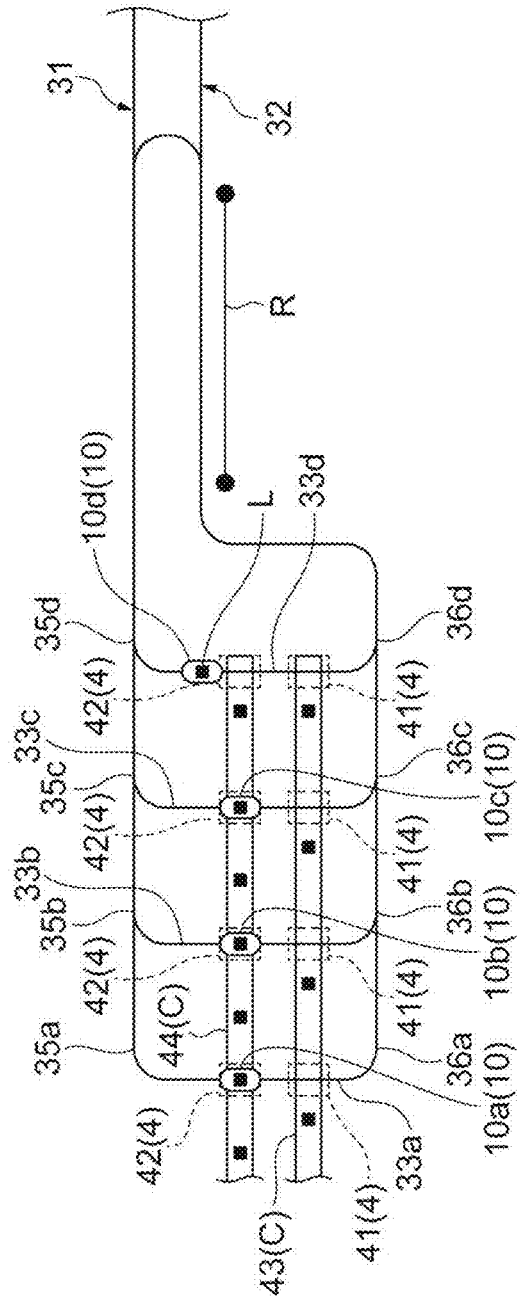

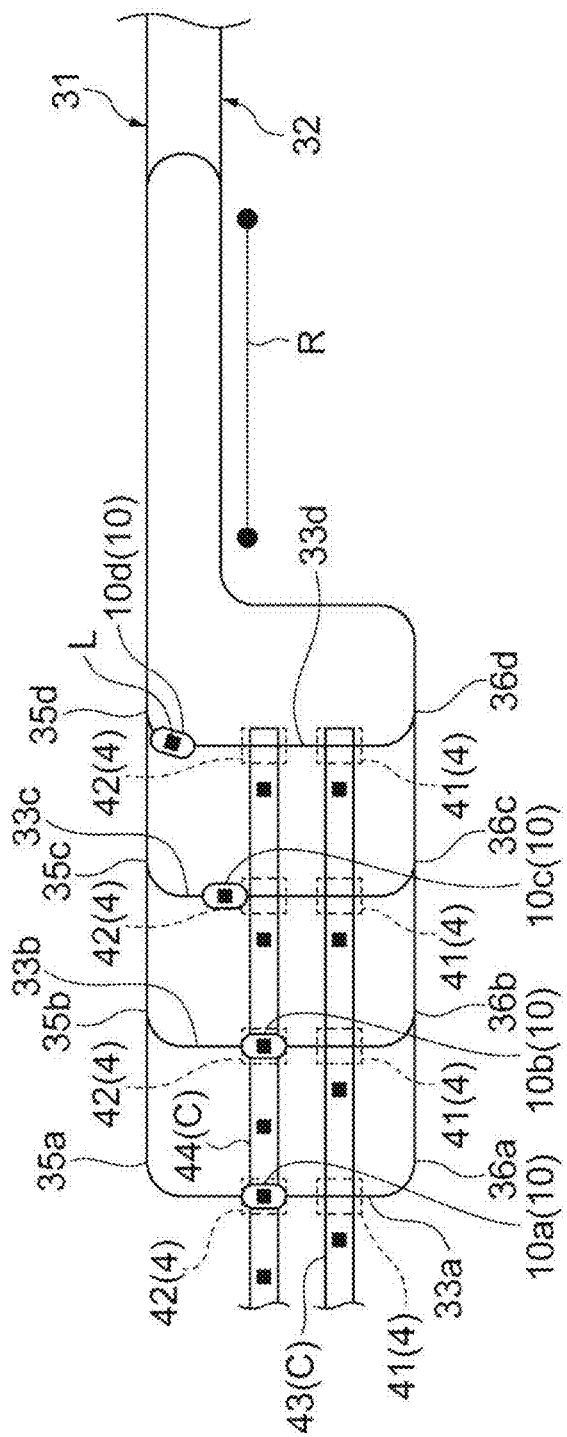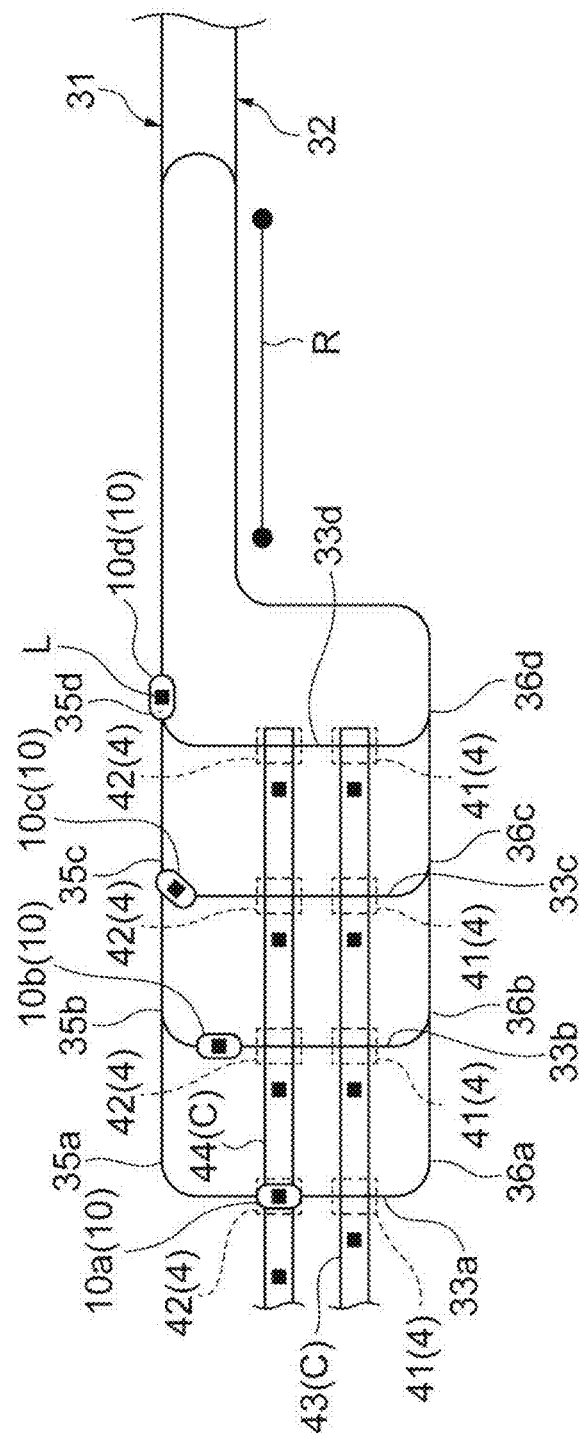

CARRIER SYSTEM

BACKGROUND OF THE INVENTION

1. Field of the Invention

One aspect of the present invention relates to a transport system.

2. Description of the Related Art

Conventionally, a transport system including a plurality of transport vehicles configured to travel along a track and a controller configured to control the transport vehicles has been known. As a technique related to such a transport system, for example, Japanese Unexamined Patent Publication No. 2009-214974 describes a system in which a transport command is assigned to each traveling vehicle (transport vehicle) from the controller to convey, deliver, and receive an article (load).

In the above-described transport system, there is a case in which a transport vehicle that is going to pass through a junction point of the track needs to stop in order to wait until another transport vehicle that is passing through this junction point has passed therethrough. In this case, the efficiency of conveying loads may decrease.

SUMMARY OF THE INVENTION

Preferred embodiments of the present invention provide transport systems that each improve an efficiency of conveying loads.

A transport system according to a preferred embodiment of the present invention is a transport system including: a plurality of transport vehicles that travel along a track and convey a load; and a controller configured or programmed to control traveling of the transport vehicles. The track includes a first main track, a plurality of junction points on the first main track and spaced apart from each other, and a plurality of branch tracks each connected to the first main track via the junction points different from one another. The respective junction points are spaced apart from each other on the first main track. On each of the branch tracks, a stop position corresponding to a delivery port for each transport vehicle to deliver and receive a load is provided. The controller controls the respective transport vehicles stopping at the stop positions corresponding to the respective delivery ports of the branch tracks to control a transport vehicle on a downstream branch track to start simultaneously with or before a transport vehicle on an upstream branch track.

This transport system includes the branch tracks each including the stop position corresponding to the delivery port, and the branch tracks merge into the first main track. Accordingly, the transport vehicles are able to travel in a distributed manner to perform delivery and reception of loads. Furthermore, the start timing of a transport vehicle on a downstream branch track preferably is simultaneous with or earlier than the start timing of a transport vehicle on an upstream branch track. Accordingly, the transport vehicles are able to enter the first main track without being stopped as much as possible by utilizing positioning of the respective junction points that are physically spaced apart from each other. Thus, the efficiency of conveying loads is improved.

In a transport system according to a preferred embodiment of the present invention, the controller may be configured or programmed to control the respective transport vehicles, which arrive at the stop positions corresponding to the respective delivery ports of the branch tracks at different timings, to control a transport vehicle arriving earlier to wait to start until a transport vehicle arriving later arrives. By this control, a situation in which the respective transport vehicles stop simultaneously or substantially simultaneously at the respective stop positions of the branch tracks is able to be reliably provided. Thus, the above-described control of setting the start timing of a transport vehicle on a downstream branch track simultaneous with or earlier than the start timing of a transport vehicle on an upstream branch track is able to be easily performed.

In a transport system according to a preferred embodiment of the present invention, the track may further include a second main track and a plurality of branch points on the second main track and spaced apart from each other. The respective branch tracks may be connected to the second main track via the branch points different from one another. The controller may perform entering control of controlling the respective transport vehicles traveling on the second main track to enter the respective branch tracks sequentially in order from downstream to upstream. By this control, the transport vehicles area able to be distributed on the branch tracks, and the respective transport vehicles arrive at the respective stop positions of the branch tracks at the same or substantially the same timing.

In a transport system according to a preferred embodiment of the present invention, the controller may perform the entering control for each transport vehicle group including transport vehicles the number of which corresponds to the number of the branch tracks. By this control, the entering control is able to be performed with relatively simple logic.

In a transport system according to a preferred embodiment of the present invention, the controller may be configured or programmed to determine a delivery port as a destination for a transport vehicle traveling in a specified section upstream of each branch point on the second main track. In the transport system, a situation in which the total number of the transport vehicles increases or decreases due to some circumstances may occur. However, for example, when a delivery port as a destination is determined immediately after loading onto a transport vehicle, this situation is not able to be handled appropriately, which may result in the row of the transport vehicles becoming disordered. Therefore, according to this preferred embodiment of the present invention, because the delivery port as a destination is determined for a transport vehicle traveling in the specified section of the second main track, even if the above-described situation has occurred, the delivery port as a destination is able to be easily determined accordingly. The row of the transport vehicles is able to be prevented from becoming disordered, and the efficiency of conveying loads is able to be significantly increased.

In a transport system according to a preferred embodiment of the present invention, the controller may result in the respective transport vehicles stopping at the stop positions corresponding to the respective delivery ports of the branch tracks to start at timing repeated at regular intervals for each of the branch tracks. By this control, each transport vehicle that has stopped starts at the corresponding timing even without being loaded. A higher priority is assigned to traveling of the transport vehicles. Accordingly, a higher priority is able to be provided to increase of the number of deliveries and receptions of loads during a system operation period. Thus, the efficiency of conveying loads is improved.

In a transport system according to a preferred embodiment of the present invention, the track may include a circuit track along which the transport vehicles travel in circles. The controller may be configured or programmed to control the transport vehicles to travel along the circuit track to provide circling distances or circling periods of time that are the same or substantially the same. Accordingly, the row of the transport vehicles is able to be prevented from becoming disordered, and the efficiency of conveying loads is improved.

According to the preferred embodiments of the present invention, transport systems that are able to significantly increase an efficiency of conveying loads are provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is a side view showing a transport vehicle of a transport system according to a preferred embodiment of the present invention.

FIG. 4 is a plan view showing a transport system according to a preferred embodiment of the present invention in a second building.

FIG. 6A is a plan view showing an example of operation of a transport system according to a preferred embodiment of the present invention. FIG. 6B is a plan view showing a continuation of FIG. 6A.

FIG. 7A is a plan view showing a continuation of FIG. 6B. FIG. 7B is a plan view showing a continuation of FIG. 7A.

FIG. 8A is a plan view showing a continuation of FIG. 7B. FIG. 8B is a plan view showing a continuation of FIG. 8A.

FIG. 9A is a plan view showing a continuation of FIG. 8B. FIG. 9B is a plan view showing a continuation of FIG. 9A.

FIG. 10A is a plan view showing a continuation of FIG. 9B. FIG. 10B is a plan view showing a continuation of FIG. 10A.

DETAILED DESCRIPTION OF THE PREFERRED EMBODIMENTS

Figure 1:
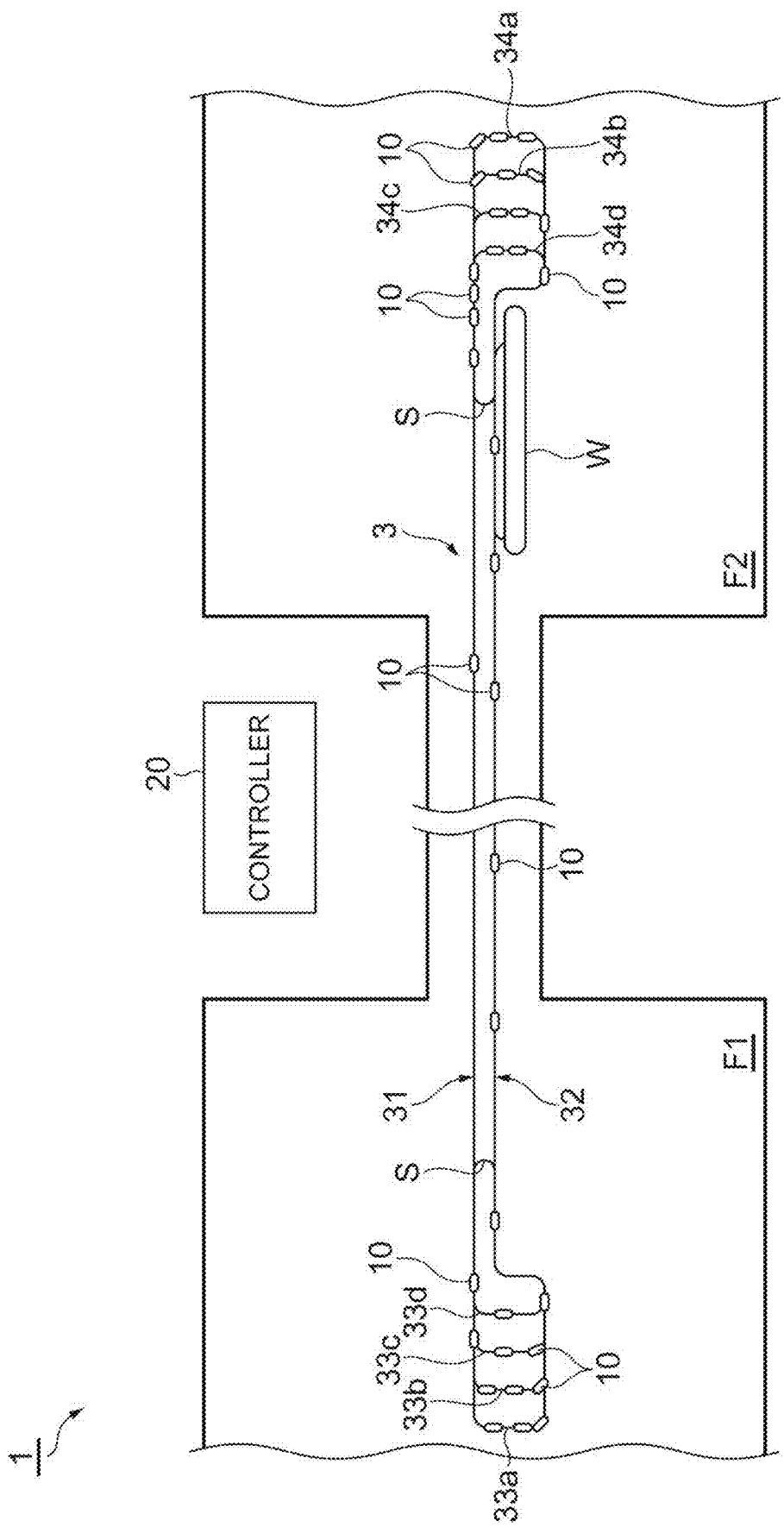
FIG. 1 is a plan view showing a transport system according to a preferred embodiment of the present invention.

Preferred embodiments of the present invention will now be described with reference to the drawings. In description of the drawings, like elements are designated by like reference signs, and duplicate description is omitted. The scale in the drawings does not necessarily coincide with the size of a described object.

As shown in FIG. 1, a transport system 1 is a system to perform transport between two points in which a source and a destination are patterned. The transport system 1 performs inter-building transport of delivering and receiving loads L between a first building F1 and a second building F2. The loads L are containers that each store a plurality of semiconductor wafers, for example, and may be glass substrates and general portions, for example.

The transport system 1 includes a plurality of transport vehicles 10 and a controller 20. Each transport vehicle 10 travels along a track 3 to convey a load L. The transport vehicle 10 is able to transfer the load L. The transport vehicle 10 is an overhead traveling automated guided transport vehicle. The transport vehicle 10 is also called, for example, a carriage (transport carriage), an overhead traveling vehicle (overhead traveling carriage), or a traveling vehicle (traveling carriage). The number of transport vehicles 10 that the transport system 1 includes may be about 50, for example, which depends on the quantity of a desired or required transport and transport distance.

As shown in FIG. 2, each transport vehicle 10 includes a traveling carriage 144, a power-supply carriage 145 to receive power supply from the track 3, a θ drive 147, and a cross-feeder 146 to feed a portion of the transport vehicle 10 lower than the cross-feeder 146 laterally with respect to the track 3. The θ drive 147 turns a lifting driver 148 in a horizontal plane to control the attitude of a load L. The lifting driver 148 raises and lowers a lifting platform 149 holding the load L to deliver and receive the load L to and from a delivery port 4. The lifting platform 149 holds with a chuck a flange 120 of an upper portion of the load L. Herein, the cross-feeder 146 and the θ drive 147 do not have to be provided.

The track 3 is installed on a ceiling, for example. The track 3 is supported by posts 141. The track 3 is a predetermined travel path along which the transport vehicles 10 travel. The track 3 is a one-way travel path. In other words, in the transport system 1, as shown by arrows in FIG. 3 and FIG. 4, the traveling direction (advancing direction) of each transport vehicle 10 on the track 3 is set to be one direction, and traveling in the opposite direction is prohibited. The track 3 has a closed track layout that is not affected by outside of the track 3. Hereinafter, the terms "upstream" and "downstream" correspond to "upstream" and "downstream" in the traveling direction of the transport vehicle 10, respectively.

In the example shown in FIG. 1, the track 3 includes a first main track 31, a second main track 32, four first branch tracks (branch tracks) 33a, 33b, 33c, 33d that diverge from the second main track 32 and merge into the first main track 31, and four second branch tracks 34a, 34b, 34c, 34d that diverge from the first main track 31 and merge into the second main track 32.

The first main track 31 and the second main track 32 are tracks extending within and between the first building F1 and the second building F2. The lengths of the first main track 31 and the second main track 32 are each 200 meters, for example. Within and between the first building F1 and the second building F2, the first main track 31 and the second main track 32 are surrounded and enclosed by a wall (not shown).

The first branch tracks 33a to 33d are located in the first building F1. The first branch tracks 33a to 33d extend straight or substantially straight and in parallel or substantially in parallel. The first branch tracks 33a to 33d are provided in a comb shape between the first main track 31 and the second main track 32 that extend parallel or substantially parallel. The first branch tracks 33a to 33d are located upstream of the first main track 31 (downstream of the second main track 32) in this order. The second branch tracks 34a to 34d are located in the second building F2. The second branch tracks 34a to 34d extend straight or substantially straight and in parallel or substantially in parallel. The second branch tracks 34a to 34d are provided in a comb shape between the first main track 31 and the second main track 32 that extend parallel or substantially parallel. The second branch tracks 34a to 34d are located upstream of the second main track 32 (downstream of the first main track 31) in this order.

Figure 3:
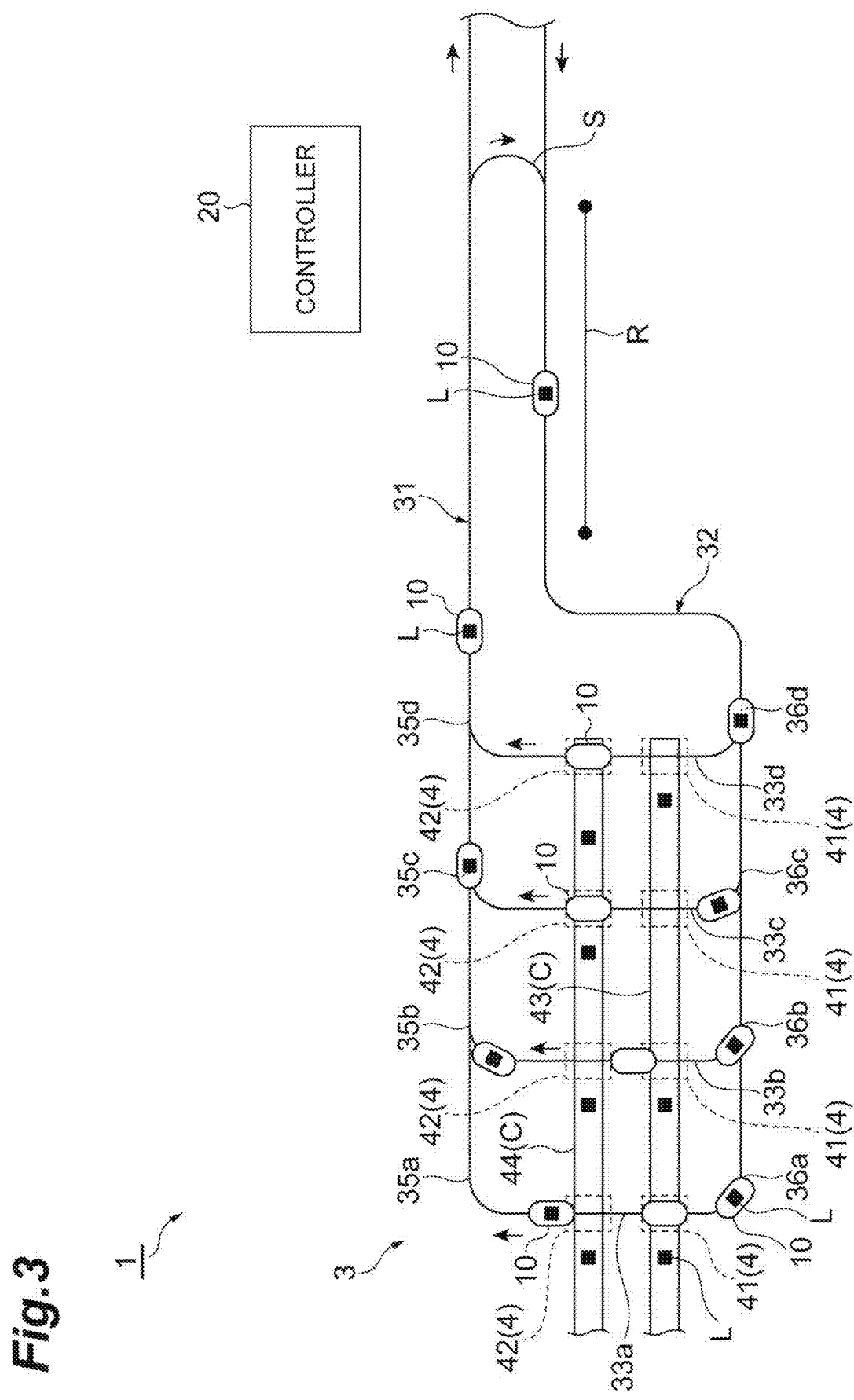
FIG. 3 is a plan view of a transport system according to a preferred embodiment of the present invention in a first building.
Figure 5A:
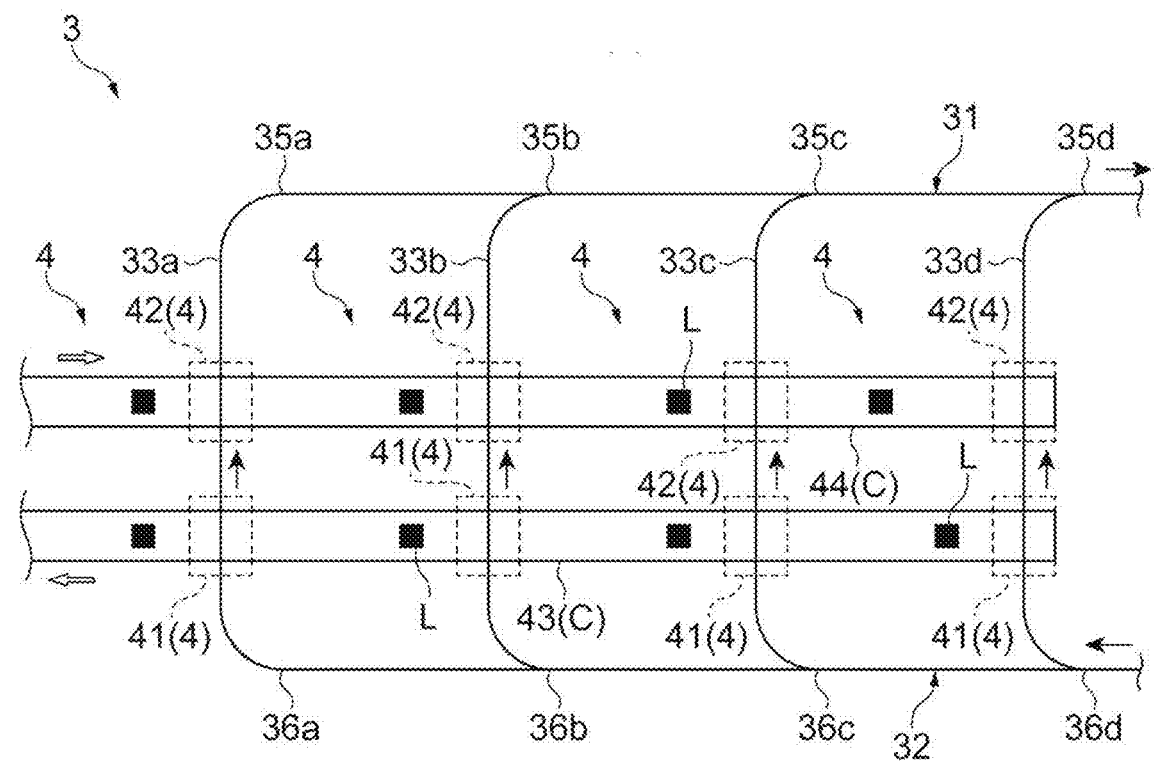
FIG. 5A is a plan view showing a track of a transport system according to a preferred embodiment in the first building.

As shown in FIG. 3 and FIG. 5A, respective locations where the first branch tracks 33a to 33d merge into the first main track 31 are junction points 35a, 35b, 35c, 35d. The respective first branch tracks 33a to 33d are connected to the first main track 31 via the respective junction points 35a, 35b, 35c, 35d. In other words, the track 3 has the junction points 35a to 35d that are a plurality of junction points provided on the first main track 31 and spaced apart from each other. The first branch tracks 33a to 33d are connected to the first main track 31 via the junction points 35a to 35d that are different from one another, respectively. The junction points 35a to 35d are spaced apart from each other at predetermined distances on the first main track 31.

Respective locations where the first branch tracks 33a to 33d diverge from the second main track 32 are branch points 36a, 36b, 36c, 36d. The respective first branch tracks 33a to 33d are connected to the second main track 32 via the respective branch points 36a, 36b, 36c, 36d. In other words, the track 3 has the branch points 36a to 36d as a plurality of branch points that are provided on the second main track 32 and spaced apart from each other. The first branch tracks 33a to 33d are connected to the second main track 32 via the branch points 36a to 36d different from one another, respectively. The branch points 36a to 36d are spaced apart from each other at predetermined distances on the second main track 32.

The "junction points" mean locations where branch tracks are connected to a main track. The "junction points" are locations where the branch tracks reach the main track. The "junction points" are connecting points of the branch tracks for entry therefrom into the main track. The "branch points" are locations where branch tracks are connected to a main track. The "branch points" are locations where the main track reaches the branch tracks. The "branch points" are connecting points of the branch tracks for entry thereinto from the main track.

Figure 5B:
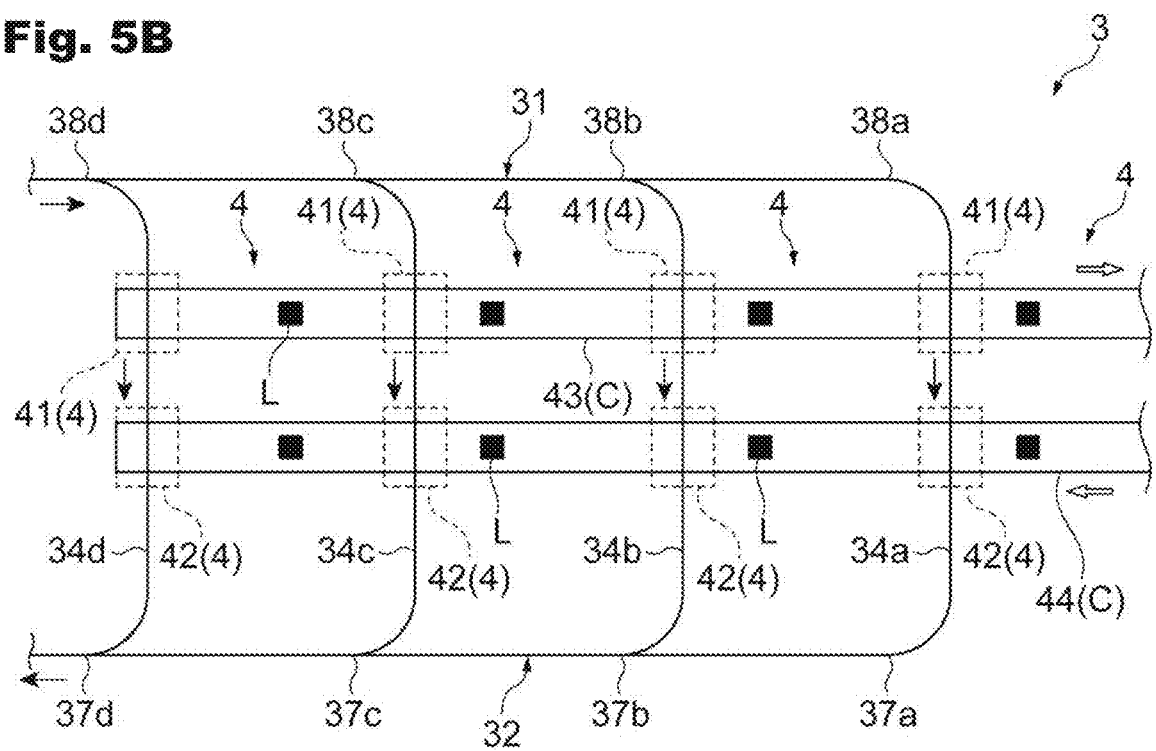
FIG. 5B is a plan view showing a track of a transport system according to a preferred embodiment of the present invention in the second building.

As shown in FIG. 4 and FIG. 5B, respective locations where the second branch tracks 34a to 34d merge into the second main track 32 are junction points 37a, 37b, 37c, 37d. The respective second branch tracks 34a to 34d are connected to the second main track 32 via the respective junction points 37a, 37b, 37c, 37d. In other words, the track 3 has the junction points 37a to 37d as a plurality of junction points that are provided on the second main track 32 and spaced apart from each other. The second branch tracks 34a to 34d are connected to the second main track 32 via the junction points 37a to 37d different from one another, respectively. The junction points 37a to 37d are spaced apart from each other at predetermined distances on the second main track 32.

Respective locations where the second branch tracks 34a to 34d diverge from the first main track 31 are branch points 38a, 38b, 38c, 38d. The respective second branch tracks 34a to 34d are connected to the first main track 31 via the respective branch points 38a, 38b, 38c, 38d. In other words, the track 3 has the branch points 38a to 38d as a plurality of branch points that are provided on the first main track 31 and spaced apart from each other. The second branch tracks 34a to 34d are connected to the first main track 31 via the branch points 38a to 38d different from one another, respectively. The branch points 38a to 38d are spaced apart from each other at predetermined distances on the first main track 31.

As shown in FIG. 1, the first main track 31, the second main track 32, the first branch tracks 33a to 33d, and the second branch tracks 34a to 34d define circuit tracks along which the transport vehicles 10 travel in circles. Other than these circuit tracks, the track 3 includes a stand-by track W on which, for example, a transport vehicle 10 having a problem or a backup transport vehicle 10 is kept on standby. The track 3 also includes a short-cut track S connecting directly between the first main track 31 and the second main track 32.

As shown in FIGS. 5A and 5B, each of the first branch tracks 33a to 33d and the second branch tracks 34a to 34d has a stop position corresponding to a delivery port 4 to and from which a transport vehicle 10 delivers and receives a load L. Each delivery port 4 has an unloading port 41 and a loading port 42. The delivery port 4 is provided above a conveyor C to convey loads L. The conveyor C is located below the track 3. The conveyor C extends and passes through the respective delivery ports 4 of the first branch tracks 33a to 33d. The conveyor C includes a conveyor 43 and a conveyor 44.

The unloading port 41 is a port to unload a load L from a transport vehicle 10. At the unloading port 41, before the subsequent transport vehicle 10 arrives after a load L has been put thereon, this load L is conveyed out. The unloading port 41 is located upstream of the loading port 42 at a predetermined spacing. In other words, the loading port 42 is located downstream of the unloading port 41 at the predetermined spacing. The unloading port 41 is provided above the conveyor 43. The conveyor 43 conveys a load L unloaded onto the unloading port 41 to an automated warehouse (not shown), for example.

The loading port 42 is a port to unload a load L onto a transport vehicle 10. The loading port 42 is able to convey a load L into a port in a span when a plurality of transport vehicles 10 continuously arrive. The unloading port 42 is provided above the conveyor 44. The conveyor 44 conveys a load L to be loaded on the loading port 42 from the automated warehouse (not shown), for example.

Herein, the delivery port 4 may be displaced toward upstream or downstream in the transport direction of the transport vehicle 10 from a transport surface of the conveyor C to not stop transport of loads L by the conveyor C. The unloading port 41 and the loading port 42 are not limited to particular ones, and various known types of ports may be included. The specification, mechanism, configuration, or the like of the conveyors 43, 44 are not limited to particular ones, and various known types of conveyors may be included.

As shown in FIG. 3, the controller 20 preferably is an electronic controller including a central processing unit (CPU), a read only memory (ROM), and a random access memory (RAM). The controller 20 may be implemented as, for example, software provided by a program stored in the ROM that is loaded into the RAM to be executed by the CPU. The controller 20 may be implemented as hardware, for example, an electronic circuit. The controller 20 is configured or programmed to communicate with the transport vehicles 10 to control traveling of the transport vehicles 10.

The controller 20 performs starting control described below on the respective transport vehicles 10 stopping at stop positions corresponding to the respective delivery ports 4 of the first branch track 33a to 33d (herein, stop positions corresponding to the loading ports 42, and the same applies, hereinafter).

In the starting control, a transport vehicle 10 stopping on a downstream first branch track of the first branch tracks 33a to 33d is controlled to start simultaneously with or before a transport vehicle 10 stopping on an upstream first branch track thereof. The terms "downstream first branch track" and "upstream first branch track" mean that, among any two of the first branch tracks 33a to 33d, one on the downstream side belongs to the former and the other on the upstream side belongs to the latter.

Specifically, in the starting control, a transport vehicle 10 stopping on the first branch track 33d is controlled to start simultaneously with or before a transport vehicle 10 stopping on the first branch track 33c. The transport vehicle 10 stopping on the first branch track 33c is controlled to start simultaneously with or before a transport vehicle 10 stopping on the first branch track 33b. The transport vehicle 10 stopping on the first branch track 33b is controlled to start simultaneously with or before a transport vehicle 10 stopping on the first branch track 33a.

More specifically, by the starting control, each transport vehicle 10 that has stopped is controlled to start (forcedly start) at timing repeated at regular intervals for each of the first branch tracks 33a to 33d regardless of whether a load L is loaded. For example, in the starting control, for each of the first branch tracks 33a to 33d, a pitch timer starts counting down from a reference pitch time. When the count of the pitch timer has reached zero, a transport vehicle 10 stopping at the corresponding stop position is controlled to start and also the count of the pitch timer is reset to the reference pitch time. The pitch timer then continues to count down. The reference pitch time may be a fixed value that is set in advance, or may be a variable value. In the present preferred embodiment, the time axes of the respective pitch timers of the first branch tracks 33a to 33d are shifted, and a transport vehicle 10 stopping on a downstream first branch track starts earlier.

Herein, in the starting control, a time limit may be set to assign a load L to each transport vehicle 10 stopping at the stop position corresponding to each loading port 42. By setting the time limit, loading operation is able to be reliably completed before the time of forced start.

The controller 20 performs, on the respective transport vehicles 10 that arrive at the stop positions corresponding to the respective delivery ports 4 of the first branch tracks 33a to 33d at different timings, stand-by control to cause a transport vehicle 10 arriving earlier to wait to start until a transport vehicle 10 arriving later arrives. Specifically, in the stand-by control, by setting the above-described reference pitch time of the starting control to a length for transport vehicles 10 to stop on all of the first branch tracks 33a to 33d at the same or substantially the same time, the transport vehicle 10 arriving earlier is controlled to wait to start until the transport vehicle 10 arriving later arrives.

The controller 20 performs entering control to cause the respective transport vehicles 10 traveling on the second main track to enter the respective first branch tracks 33a to 33d sequentially in the order from downstream to upstream. Specifically, in the entering control, a transport vehicle 10 is controlled to enter the first branch track 33a, a subsequent transport vehicle 10 is controlled to enter the first branch track 33b, a subsequent transport vehicle 10 is controlled to enter the first branch track 33c, a subsequent transport vehicle 10 is controlled to enter the first branch track 33d, and then such entries of transport vehicle 10 are repeated.

In the entering control, destination-determining control of determining (guiding) a destination is performed on a transport vehicle 10 traveling in a specified section R upstream of the respective branch points 36a to 36d on the second main track 32. The specified section R is a straight or substantially straight section adjacent to or in a vicinity of the respective branch points 36a to 36d. The specified section R is not limited to a particular one if it is located upstream of the respective branch points 36a to 36d. In the destination-determining control, a delivery port 4 (herein, any one unloading port 41 in the first branch tracks 33a to 33d) as a destination in an already-received transport command is determined. The already-received transport command is a command received when a load L has been assigned at this loading port 42 in the second branch tracks 34a to 34d, and includes at least a command to control the transport vehicle 10 to travel to the specified section R.

The controller 20 performs virtual coupling control of performing the starting control, the stand-by control, and the entering control described above for each transport vehicle group including four transport vehicles 10 the number of which corresponds to that of the first branch tracks 33a to 33d.

The controller 20 performs controls the same as or similar to the above-described controls, which are the starting control, the stand-by control, the entering control, the destination-determining control, and the virtual coupling control described above also on transport vehicles 10 that enter the second branch tracks 34a to 34d shown in FIG. 4 and are going to exit therefrom.

As shown in FIG. 3 and FIG. 4, the controller 20 controls a plurality of transport vehicles 10 to travel along the circuit tracks (the first main track 31, the second main track 32, the first branch tracks 33a to 33d, and the second branch tracks 34a to 34d), and their circling distances or their circling periods of time become the same or substantially the same. Specifically, in the entering control, the controller 20 controls a transport vehicle 10 that has been controlled to enter the first branch track 33d to enter the second branch track 34a, controls a transport vehicle 10 that has been controlled to enter the first branch track 33c to enter the second branch track 34b, controls a transport vehicle 10 that has been controlled to enter the first branch track 33b to enter the second branch track 34c, and controls a transport vehicle 10 that has been controlled to enter the first branch track 33a to enter the second branch track 34d. Furthermore, in the entering control, the controller 20 controls the transport vehicle 10 that has been controlled to enter the second branch track 34d to enter the first branch track 33a, controls the transport vehicle 10 that has been controlled to enter the second branch track 34c to enter the first branch track 33b, controls the transport vehicle 10 that has been controlled to enter the second branch track 34b to enter the first branch track 33c, and controls the transport vehicle 10 that has been controlled to enter the second branch track 34a to enter the first branch track 33d.

The following describes one example of controls performed by the controller 20 with reference to FIGS. 6A and 6B to FIG. 11.

Hereinafter, traveling of transport vehicles 10 on the track 3 in the first building F1 will be described for convenience in description, and description of traveling of transport vehicle 10 in the second building F2 is omitted. In these drawings, only a transport vehicle group including four transport vehicles 10a to 10d is shown, and the other transport vehicles 10 are omitted. A transport vehicle 10 that a load L overlaps designates a state of being loaded with the load L. A transport vehicle 10 that a load L does not overlap indicates an empty state of not being loaded with a load L. A transport vehicle 10 filled with light gray indicates a state of being assigned with a transport command. The transport vehicles 10a to 10d travel on the track 3 in this order.

As shown in FIG. 6A, the transport vehicle 10a traveling on the second main track 32 is controlled to enter the first branch track 33a by the entering control. Specifically, when the transport vehicle 10a is traveling in the specified section R, the destination-determining control is performed to determine that the destination is the unloading port 41 of the first branch track 33a. The transport vehicle 10a is controlled to travel toward the determined destination, and the transport vehicle 10a is controlled to enter the first branch track 33a. Similarly, as shown in FIG. 6B, the transport vehicles 10b to 10d traveling on the second main track 32 are controlled to enter the first branch tracks 33b to 33d in this order by the entering control.

Subsequently, as shown in FIG. 7A, the respective transport vehicles 10a to 10d are controlled to stop sequentially at the stop positions corresponding to the respective unloading ports 41 of the first branch tracks 33a to 33d. As shown in FIG. 7B, the loads L of the transport vehicles 10a to 10d are unloaded onto the respective unloading ports 41. As shown in FIG. 8A, the transport vehicles 10a to 10d are controlled to move sequentially to the respective loading ports 42, and the transport vehicles 10a to 10d are controlled to stop sequentially at the stop positions corresponding to the respective loading ports 42. Movement from the unloading ports 41 to the loading ports 42 is able to be performed by known general travel control. For example, when a transport vehicle 10 that is a previous vehicle of the transport vehicle 10a and has stopped at the stop position of the loading port 42 starts, the transport vehicle 10a is controlled to move accordingly.

As shown in FIG. 8B, loads L are assigned to the respective transport vehicles 10a to 10d that have stopped at the stop positions corresponding to the respective loading ports 42. At this time, transport commands including commands to control the transport vehicles 10 to travel to the specified section R in the second building F2 (see FIG. 4) are assigned. As shown in FIG. 9A, the assigned loads L are loaded onto the respective transport vehicles 10a to 10d that have stopped.

Figure 11:
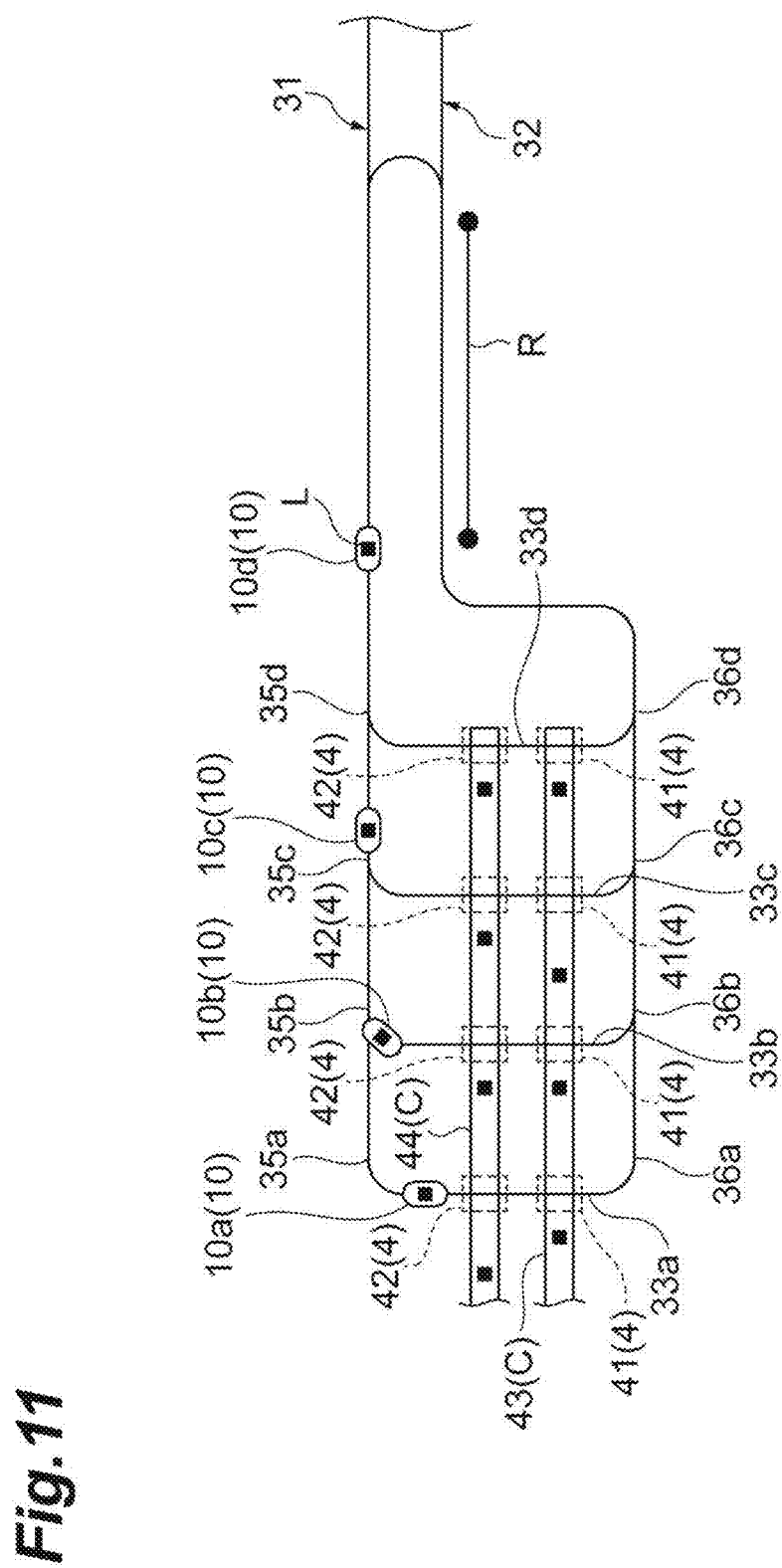
FIG. 11 is a plan view showing a continuation of FIG. 10B.

As shown in FIG. 9B, by the starting control, the transport vehicle 10d stopping on the first branch track 33d is controlled to start before the transport vehicle 10c stopping on the first branch track 33c. As shown in FIG. 10A, by the starting control, the transport vehicle 10c stopping on the first branch track 33c is controlled to start before the transport vehicle 10b stopping on the first branch track 33b. As shown in FIG. 10B, by the starting control, the transport vehicle 10b stopping on the first branch track 33b is controlled to start before the transport vehicle 10a stopping on the first branch track 33a. As shown in FIG. 11, by the starting control, the transport vehicle 10a stopping on the first branch track 33a is controlled to start after the transport vehicles 10b to 10d have started.

In the starting control herein, for each of the first branch tracks 33a to 33d, the pitch timer repeats counting down from the reference pitch time to zero. The counting down is repeated such that the count of the pitch timer becomes zero earlier in the order of the first branch tracks 33d, 33c, 33b, and 33a. When the count of the pitch timer has reached zero, each transport vehicle 10 stopping at the corresponding stop position is controlled to start forcedly. Thus, the transport vehicles 10d, 10c, 10b, 10a stopping are controlled to start in this order.

Herein, the counts of the pitch timers in the first branch tracks 33a, 33b may be set to become zero at the same or substantially the same timing. In this case, the transport vehicles 10a, 10b stopping at the stop positions of the first branch tracks 33a, 33b are controlled to start simultaneously or substantially simultaneously. Alternatively or in addition to this, the counts of the pitch timers in the first branch tracks 33b, 33c may be set to become zero at the same or substantially the same timing. In this case, the transport vehicles 10b, 10c stopping at the stop positions of the first branch tracks 33b, 33c are controlled to start simultaneously or substantially simultaneously. Alternatively or in addition to any one of these, the counts of the pitch timers in the first branch tracks 33c, 33d may be set to become zero at the same or substantially the same timing. In this case, the transport vehicles 10c, 10d stopping at the stop positions of the first branch tracks 33c, 33d are controlled to start simultaneously or substantially simultaneously.

Figure 12A:
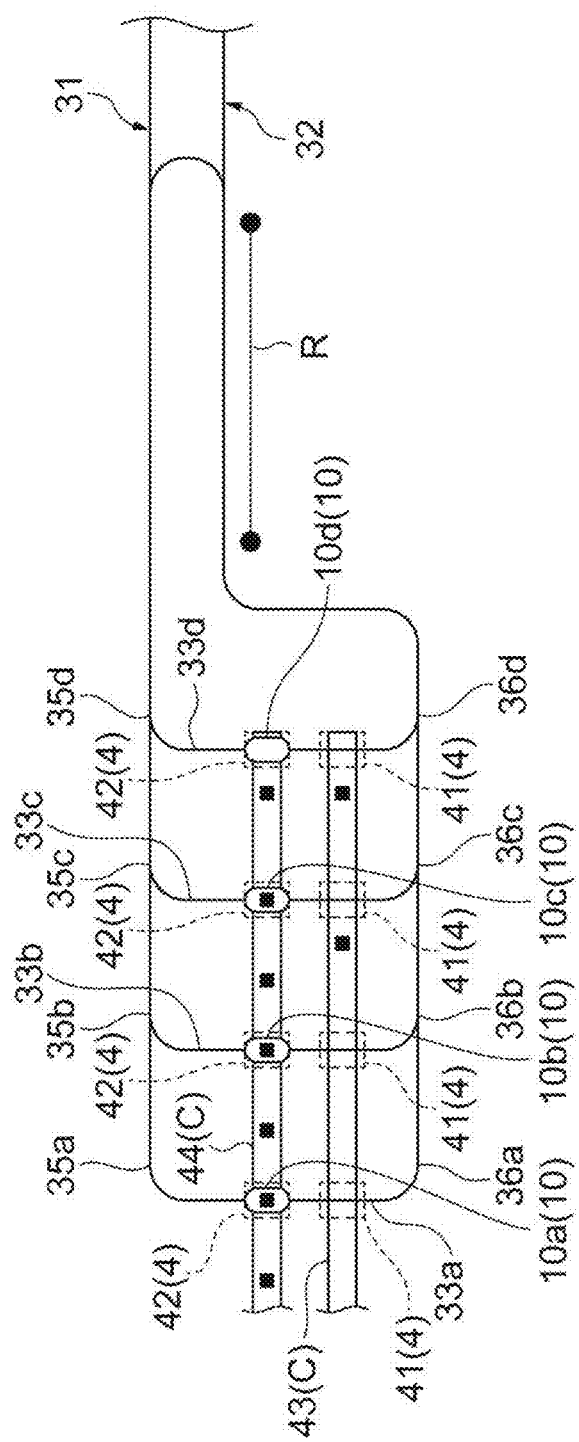
FIG. 12A is a plan view showing an example of operation when loading operation is not able be completed in a transport system according to a preferred embodiment of the present invention.
Figure 12B:
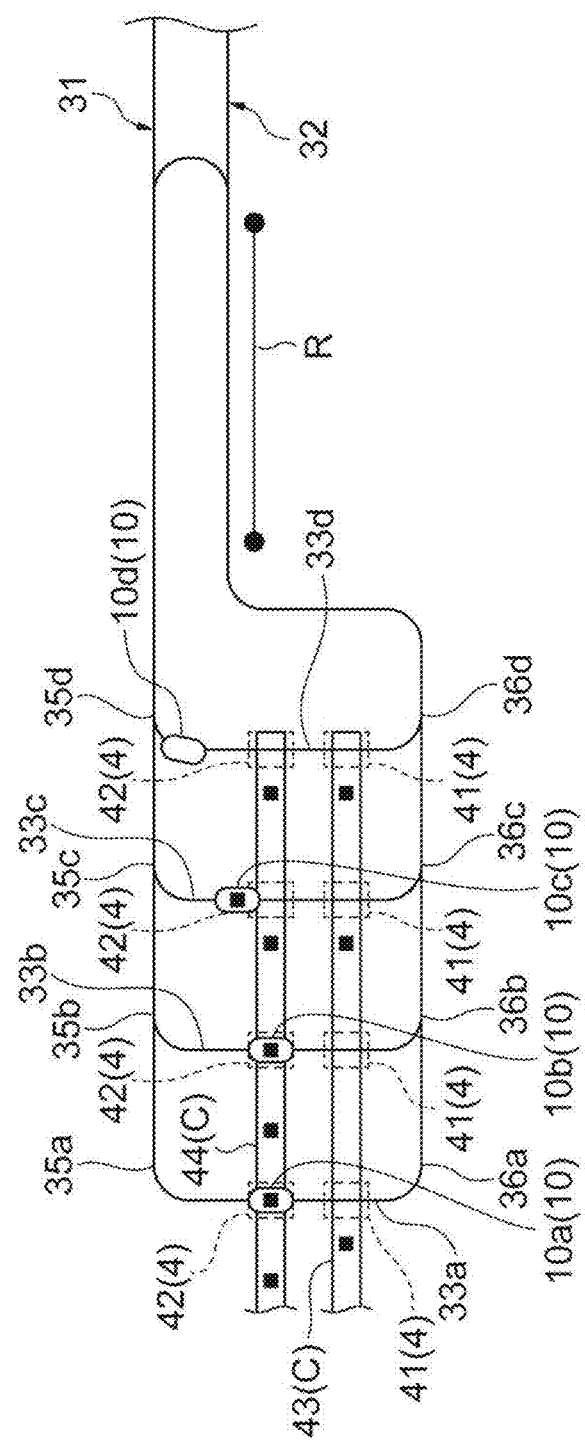
FIG. 12B is a plan view showing a continuation of FIG. 12A.

FIGS. 12A and 12B include plan views showing an example of operation when loading operation is not able to be completed. As shown in FIG. 12A, for example, if a time to load onto the transport vehicle 10d has been determined to exceed a time limit, loading operation onto the transport vehicle 10d is determined as not being able to be completed, and the transport vehicle 10 is left empty without assigning a load L to the transport vehicle 10d. As shown in FIG. 12B, when the count of the pitch timer has reached zero, the transport vehicle 10d is controlled to start even without being loaded.

As described in the foregoing, the transport system 1 includes the first branch tracks 33a to 33d each having a stop position corresponding to the delivery port 4, and these first branch tracks 33a to 33d merge into the first main track 31. The transport system 1 also includes the second branch tracks 34a to 34d each having a stop position corresponding to the delivery port 4, and these second branch tracks 34a to 34b merge into the second main track 32. Accordingly, a plurality of transport vehicles 10 is able to travel in a distributed manner to perform delivery and reception of loads L.

Furthermore, by the above-described starting control, the start timing of a transport vehicle 10 on a downstream branch track of the first branch tracks 33a to 33d is set simultaneous with or earlier than the start timing of a transport vehicle 10 on an upstream branch track of the first branch track 33a to 33d. Thus, by utilizing the positioning of the respective junction points 35a to 35d that are physically spaced apart from each other, in comparison with the case in which an upstream transport vehicle 10 is controlled to start earlier, the transport vehicles 10 are able to be controlled to enter the first main track 31 without being stopped as much as possible. Similarly, by the above-described starting control, the start timing of a transport vehicle 10 on a downstream branch track of the second branch tracks 34a to 34d is set simultaneous with or earlier than the start timing of a transport vehicle 10 on an upstream branch track of the second branch tracks 34a to 34d. Thus, by utilizing the positioning of the respective junction points 37a to 37d that are physically spaced apart from each other, in comparison with the case in which an upstream transport vehicle 10 is controlled to start earlier, the transport vehicles 10 are able to be controlled to enter the second main track 32 without being stopped as much as possible. Accordingly, with the transport system 1, the efficiency of conveying loads L is improved.

In the transport system 1, the respective transport vehicles 10 arriving at the stop positions corresponding to the respective delivery ports 4 at different timings are controlled, and a transport vehicle 10 arriving earlier is controlled to wait to start until a transport vehicle 10 arriving later arrives. By this control, a situation in which the respective transport vehicles 10 stop simultaneously or substantially simultaneously at the respective stop positions is able to be reliably provided. The above-described starting control is able to be easily performed.

In the transport system 1, the respective branch points 36a to 36d of the first branch tracks 33a to 33d are spaced apart from each other on the second main track 32. By the entering control, the respective transport vehicles 10 traveling on the second main track 32 are controlled to enter the respective first branch tracks 33a to 33d sequentially in the order from downstream to upstream. By this control, the transport vehicles 10 are able to be distributed on the first branch tracks 33a to 33d, and the respective transport vehicles 10 arrive at the respective stop positions of the first branch tracks 33a to 33d at the same or substantially the same timing. Branch traveling in which one certain transport vehicle 10 branches off from the second main track 32 is able to be prevented from hindering branch traveling in which another transport vehicle 10 branches off from the second main track 32. The above-described starting control is able to be smoothly operated. The waiting time for the above-described stand-by control is reduced.

Similarly, the respective branch points 38a to 38d of the second branch tracks 34a to 34d are spaced apart from each other on the first main track 31. By the entering control, the respective transport vehicles 10 traveling on the first main track 31 are controlled to enter the respective second branch tracks 34a to 34d sequentially in the order from downstream to upstream. By this control, the transport vehicles 10 are able to be distributed on the second branch tracks 34a to 34d, and the respective transport vehicles 10 arrive at the respective stop positions of the second branch tracks 34a to 34d at the same or substantially the same timing. Branch traveling in which one certain transport vehicle 10 branches off from the first main track 31 is able to be prevented from hindering branch traveling in which another transport vehicle 10 branches off from the first main track 31. The above-described starting control is able to be smoothly operated. The waiting time for the above-described stand-by control is reduced.

In the transport system 1, by the above-described virtual coupling control, the entering control for entry into the first branch tracks 33a to 33d is performed for each transport vehicle group including transport vehicles 10 the number of which corresponds to the number of the first branch tracks 33a to 33d. By the above-described virtual coupling control, the entering control for entry into the second branch tracks 34a to 34d is performed for each transport vehicle group including transport vehicles 10 the number of which corresponds to the number of the second branch tracks 34a to 34d. Accordingly, the entering control is able to be performed with relatively simple logic.

In the transport system 1, a situation in which the total number of the transport vehicles 10 increases or decreases due to some circumstances may occur. However, for example, when a delivery port 4 as a destination is determined immediately after loading onto a transport vehicle 10, this situation is not able to be handled appropriately, which may result in the row of the traveling transport vehicles 10 becoming disordered. Accordingly, in the transport system 1, the delivery port 4 as a destination is determined for a transport vehicle 10 traveling in the specified section R. Thus, even if this situation has occurred, the delivery port 4 as a destination is able to be easily determined accordingly. The row of the transport vehicles 10 is able to be prevented from becoming disordered, traffic jam of the transport vehicles 10 is able to be prevented from occurring, and the efficiency of conveying loads L is improved.

In the transport system 1, the respective transport vehicles 10 stopping at the stop positions corresponding to the respective delivery ports 4 are controlled to start at timing repeated at regular intervals for each of the first branch tracks 33a to 33d and the second branch tracks 34a to 34d (when the count of the pitch timer has reached zero). Thus, each transport vehicle 10 that has stopped starts at the corresponding timing even without being loaded. A higher priority is assigned to traveling of the transport vehicles 10. Accordingly, a higher priority is able to be provided to increase of the number of deliveries and receptions of loads L during a system operation period, and the limiting value of transport amount is able to be increased. Thus, the efficiency of conveying loads L is improved.

In the transport system 1, the track 3 includes the circuit tracks (the first main track 31, the second main track 32, the first branch tracks 33a to 33d, and the second branch tracks 34a to 34d) along which the transport vehicles 10 travel in circles. In the transport system 1, the transport vehicles 10 are controlled to travel along the circuit tracks, and their circling distances or their circling periods of time become the same or substantially the same. Accordingly, in comparison with the case in which the circling distances or the circling periods of time of the transport vehicles 10 are different, the row of the transport vehicles 10 is able to be prevented from becoming disordered. Traffic jam of the transport vehicles 10 is able to be prevented from occurring. The efficiency of conveying loads L is improved.

The transport system 1 is able to perform control to unload the transport vehicles 10 simultaneously or substantially simultaneously in parallel and to load the transport vehicles 10 simultaneously or substantially simultaneously in parallel. In the transport system 1, in comparison with blocking control by a passage permission request, a passage permission command, or a passage prohibition command, for example, the transport vehicles 10 are able to be controlled with relatively simple logic. In the transport system 1, in comparison with a transport system that communicates by polling communication, the time required for communication is reduced.

According to the control performed by transport system 1, when a transport vehicle 10 is going to enter a junction point or a branch point, permission for this entry is requested of the controller 20, and this entry is performed when the permission has been received from the controller 20. Under the control described above, in the transport system 1, there is no case in which the permission is not able to be received from the controller 20, and the transport vehicle 10 is able to travel smoothly without being stopped in front of the junction point or the branch point.

Although preferred embodiments have been described above, the present invention is not limited to the preferred embodiments described above, and various modifications may be made within the scope not departing from the gist and scope of the present invention.

In the above-described preferred embodiments, the track 3 includes four first branch tracks 33a, 33b, 33c, 33d.

However, the number of the first branch tracks may be two, may be three, or may be five or more. The track 3 also includes four second branch tracks 34a, 34b, 34c, 34d. However, the number of the second branch tracks may be two, may be three, or may be five or more.

In the preferred embodiments, the destination-determining control of determining a destination for a transport vehicle 10 traveling in the specified section R is performed. However, the destination-determining control does not have to be performed, and a delivery port 4 as a destination may be determined at any timing. In the preferred embodiments, the stand-by control of controlling a transport vehicle 10 arriving at a stop position earlier to wait to start is performed. However, the stand-by control does not have to be performed. In the preferred embodiments, the entering control of controlling transport vehicles 10 to enter the first branch tracks 33a to 33d and the second branch tracks 34a to 34d sequentially in the order from downstream to upstream is performed. However, the entering control does not have to be performed. In the preferred embodiments, the virtual coupling control of performing control for each transport vehicle group including a plurality of transport vehicles 10 is performed. However, the virtual coupling control does not have to be performed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A transport system comprising:
a plurality of transport vehicles to travel along a track and convey a load; and
a controller configured or programmed to control traveling of the transport vehicles; wherein
the track includes a first main track, a plurality of junction points provided on the first main track and spaced apart from each other, and a plurality of branch tracks each connected to the first main track via the junction points different from one another;
the respective junction points are spaced apart from each other on the first main track;
on each of the branch tracks, a stop position corresponding to a delivery port for each transport vehicle to deliver and receive a load is provided;
the controller is configured or programmed to control the respective transport vehicles stopping at the stop positions corresponding to the respective delivery ports of the branch tracks to control a transport vehicle on a downstream branch track to start simultaneously with or before a transport vehicle on an upstream branch track;
the track further includes a second main track and a plurality of branch points provided on the second main track and spaced apart from each other;
the respective branch tracks are connected to the second main track via the branch points different from one another; and
the controller is configured or programmed to perform entering control to cause the respective transport vehicles traveling on the second main track to enter the respective branch tracks sequentially in order from downstream to upstream.

2. The transport system according to claim 1, wherein the controller is configured or programmed to control the respective transport vehicles, which arrive at the stop positions corresponding to the respective delivery ports of the branch tracks at different timings, to control a transport vehicle arriving earlier to wait to start until a transport vehicle arriving later arrives.

3. The transport system according to claim 2, wherein the controller is configured or programmed to control the respective transport vehicles stopping at the stop positions corresponding to the respective delivery ports of the branch tracks to start at a timing repeated at regular intervals for each of the branch tracks.

4. The transport system according to claim 2, wherein
the track includes a circuit track along which the transport vehicles circularly travel; and
the controller is configured or programmed to control the transport vehicles to travel along the circuit track to provide circling distances or circling periods of time that are the same or substantially the same.

5. The transport system according to claim 1, wherein the controller is configured or programmed to perform the entering control for each transport vehicle group including transport vehicles a number of which corresponds to a number of the branch tracks.

6. The transport system according to claim 5, wherein the controller is configured or programmed to determine a delivery port as a destination for a transport vehicle traveling in a specified section upstream of each branch point on the second main track.

7. The transport system according to claim 5, wherein the controller is configured or programmed to control the respective transport vehicles stopping at the stop positions corresponding to the respective delivery ports of the branch tracks to start at a timing repeated at regular intervals for each of the branch tracks.

8. The transport system according to claim 5, wherein
the track includes a circuit track along which the transport vehicles circularly travel; and
the controller is configured or programmed to control the transport vehicles to travel along the circuit track to provide circling distances or circling periods of time that are the same or substantially the same.

9. The transport system according to claim 1, wherein the controller is configured or programmed to determine a delivery port as a destination for a transport vehicle traveling in a specified section upstream of each branch point on the second main track.

10. The transport system according to claim 9, wherein the controller is configured or programmed to control the respective transport vehicles stopping at the stop positions corresponding to the respective delivery ports of the branch tracks to start at a timing repeated at regular intervals for each of the branch tracks.

11. The transport system according to claim 9, wherein
the track includes a circuit track along which the transport vehicles circularly travel; and
the controller is configured or programmed to control the transport vehicles to travel along the circuit track to provide circling distances or circling periods of time that are the same or substantially the same.

12. The transport system according to claim 1, wherein the controller is configured or programmed to control the respective transport vehicles stopping at the stop positions corresponding to the respective delivery ports of the branch tracks to start at a timing repeated at regular intervals for each of the branch tracks.

13. The transport system according to claim 12, wherein
the track includes a circuit track along which the transport vehicles circularly travel; and the controller is configured or programmed to control the transport vehicles to travel along the circuit track to provide circling distances or circling periods of time that are the same or substantially the same.

14. The transport system according to claim 1, wherein the track includes a circuit track along which the transport vehicles circularly travel; and the controller is configured or programmed to control the transport vehicles to travel along the circuit track to provide circling distances or circling periods of time that are the same or substantially the same.

15. The transport system according to claim 1, wherein the controller is configured or programmed to control the respective transport vehicles stopping at the stop positions corresponding to the respective delivery ports of the branch tracks to start at a timing repeated at regular intervals for each of the branch tracks.

16. The transport system according to claim 1, wherein the track includes a circuit track along which the transport vehicles circularly travel; and the controller is configured or programmed to control the transport vehicles to travel along the circuit track to provide circling distances or circling periods of time that are the same or substantially the same.

* * * * *